(12) United States Patent
Kim et al.

(10) Patent No.: US 7,524,763 B2
(45) Date of Patent: Apr. 28, 2009

(54) FABRICATION METHOD OF WAFER LEVEL CHIP SCALE PACKAGES

(75) Inventors: Soon-Bum Kim, Suwon-si (KR);
Ung-Kwang Kim, Yongin-si (KR);
Keum-Hee Ma, Andong-si (KR);
Young-Hee Song, Yongin-si (KR);
Sung-Min Sim, Seongnam-si (KR);
Se-Yong Oh, Yongin-si (KR);
Kang-Wook Lee, Suwon-si (KR);
Se-Young Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/145,994

(22) Filed: Jun. 7, 2005

(65) Prior Publication Data
US 2005/0277293 A1    Dec. 15, 2005

(30) Foreign Application Priority Data
Jun. 15, 2004  (KR) ............... 10-2004-0044050

(51) Int. Cl.
*H01L 21/44* (2006.01)
(52) U.S. Cl. ............ 438/667; 438/110; 438/598; 438/613
(58) Field of Classification Search ......... 438/106–110, 438/111, 113, 460, 461, 462, 464, 465, 977, 438/612–614, FOR. 343, FOR. 365, 597, 438/598, 667; 257/E21.488, E21.5, E21.508, 257/E23.011, E21.575, E21.597, E21.705
See application file for complete search history.

(56) References Cited
U.S. PATENT DOCUMENTS

| | | | | | |
|---|---|---|---|---|---|
| 2,970,730 | A | * | 2/1961 | Schwarz | 225/2 |
| 3,625,837 | A | * | 12/1971 | Nelson et al. | 438/615 |
| 3,654,000 | A | * | 4/1972 | Totah et al. | 438/464 |
| 4,638,601 | A | * | 1/1987 | Steere et al. | 451/5 |

(Continued)

FOREIGN PATENT DOCUMENTS

JP         59-090941      *   5/1984

(Continued)

OTHER PUBLICATIONS

Korean Office Action dated Feb. 28, 2006.

*Primary Examiner*—Matthew Smith
*Assistant Examiner*—Quovaunda Jefferson
(74) *Attorney, Agent, or Firm*—Harness, Dickey & Pierce PLC

(57) ABSTRACT

A method of fabricating wafer level chip scale packages may involve forming a hole to penetrate through a chip pad of an IC chip. A base metal layer may be formed on a first face of a wafer to cover inner surfaces of the hole. An electrode metal layer may fill the hole and rise over the chip pad. A second face of the wafer may be grinded such that the electrode metal layer in the hole may be exposed through the second face. By electroplating, a plated bump may be formed on the electrode metal layer exposed through the second face. The base metal layer may be selectively removed to isolate adjacent electrode metal layers. The wafer may be sawed along scribe lanes to separate individual packages from the wafer.

12 Claims, 9 Drawing Sheets

U.S. PATENT DOCUMENTS

| | | | |
|---|---|---|---|
| 5,360,509 A * | 11/1994 | Zakaluk et al. | 117/106 |
| 5,705,016 A * | 1/1998 | Senoo et al. | 156/289 |
| 6,060,373 A * | 5/2000 | Saitoh | 438/459 |
| 6,117,299 A * | 9/2000 | Rinne et al. | 205/125 |
| 6,352,073 B1 * | 3/2002 | Kurosawa et al. | 125/35 |
| 6,429,096 B1 | 8/2002 | Yanagida | |
| 6,506,633 B1 * | 1/2003 | Cheng et al. | 438/126 |
| 6,793,792 B2 * | 9/2004 | Jones et al. | 205/83 |
| 6,864,172 B2 * | 3/2005 | Noma et al. | 438/674 |
| 7,078,265 B2 * | 7/2006 | Terui et al. | 438/113 |
| 2002/0004288 A1 * | 1/2002 | Nishiyama | 438/464 |
| 2002/0135069 A1 * | 9/2002 | Wood et al. | 257/758 |
| 2003/0173678 A1 * | 9/2003 | Mizukoshi | 257/774 |

FOREIGN PATENT DOCUMENTS

| | | |
|---|---|---|
| JP | 06-349799 | * 12/1994 |
| JP | 2001-210667 | 8/2001 |
| JP | 2003-273155 | 9/2003 |
| JP | 2002-170904 | 6/2006 |
| KR | 2002-0063511 | 8/2002 |

* cited by examiner

FABRICATION METHOD OF WAFER LEVEL CHIP SCALE PACKAGES

CROSS REFERENCE TO RELATED APPLICATIONS

This U.S. non-provisional application claims priority under 35 U.S.C. §119 from Korean Patent Application No. 2004-44050, which was filed in the Korean Intellectual Property Office on Jun. 15, 2004, the contents of which are incorporated by reference herein in its entirety.

BACKGROUND OF THE INVENTION

1. Field of the Invention

The present invention relates generally to electronic packaging technology and, more particularly, to a fabrication method of wafer level chip scale packages available for a three-dimensional package stack.

2. Description of the Related Art

As in other sectors of the semiconductor industry, the electronic packaging industry may be driven by a demand for packages that may be smaller, faster, cheaper, more reliable, and more multi-functional, for example. A chip scale package (CSP), which may be referred to as a chip size package, has been developed to satisfy the industry's growing demand for a small, i.e., chip-sized, form factor that may be suitably implemented in small and advanced electronic end-applications. Additionally, a wafer level chip scale package (WLCSP) has been introduced to realize cost-effective fabrication of CSPs on the wafer prior to singulation.

A three-dimensional package stack may employ the WLCSP as unit packages of the stack. The three-dimensional package stack may have electrical connections between upper and lower individual unit packages. Two conventional approaches for offering electrical connections to the WLCSP stack are discussed separately below.

According to one conventional approach, a semiconductor wafer may be thinned using a grinding technique, and then a hole may be formed that extends completely through the semiconductor wafer. A wiring plug may be formed in the hole, and a metal bump may be formed on the wiring plug. The metal bump may be connected to the wiring plug of an underlying semiconductor wafer, so that adjacent upper and lower packages may be electrically coupled to each other.

Although the conventional approach described above may generally provide acceptable results, it is not without shortcomings. For example, the wafer, which may be fabricated from silicon, may be inherently brittle. Thus, a relatively thin wafer (which may result after grinding) may not exhibit good reliability during fabrication and handling. Further, it may be difficult to form the wiring plug in the hole penetrating completely through the wafer. Moreover, the formation of the metal bump may require a complicated, lengthy and expensive process since the metal bump may be typically formed by photolithography and electroplating techniques.

According to another conventional approach, a hole may be partially formed in a relatively thick wafer, and a wiring plug may be formed in the hole. Then the wafer may be thinned using a grinding technique, and the ground face of the wafer may be selectively etched until the wiring plug is exposed. A protrusion may formed on an exposed portion of the wiring plug, and a solder ball may be formed to surround the protrusion.

This conventional approach may generally provide acceptable results, however, it is not without shortcomings. For example, the etching process as one of thinning techniques may be relatively complicated, lengthy and susceptible to delicate process conditions as compared to the mechanical grinding process. The etching process may also damage the wiring plug. Additionally, a process of forming the solder ball may be complicated and lengthy due to the presence of the protrusion, and because the solder balls may be individually positioned on the protrusions.

SUMMARY OF THE INVENTION

Exemplary, non-limiting embodiments of the present invention may provide a fabrication method of a wafer level chip scale package (WLCSP) for a package stack. As compared to conventional approaches, the present fabrication method may be more simplified, more time-effective and more cost-effective.

According to an exemplary embodiment of the present invention, the method may involve providing a wafer including a first face, a second face, a plurality of integrated circuit (IC) chips having chip pads on the first face, and scribe lanes running between the IC chips. The method may further involve forming holes in the first face of the wafer such that the holes respectively penetrate through the chip pads. A base metal layer may be formed on the first face of the wafer such that the base metal layer covers inner surfaces of the holes. Electrode metal layers may be respectively formed on the chip pads such that the electrode metal layers may respectively fill the holes. The second face of the wafer may be ground such that the electrode metal layers are exposed through the second face of the wafer. Plated bumps may be formed respectively on the electrode metal layer exposed through the second face of the wafer. The base metal layer located between the electrode metal layers may be selectively removed. The wafer may be separated along the scribe lanes.

The method may further include forming an insulating layer on inner surfaces of the holes. The holes may be formed by at least one of laser drilling, wet etching, and dry etching. The base metal layer may be fabricated from a material selected from at least one of chromium, titanium, silver, gold, copper, nickel, palladium, platinum, and alloys thereof. The electrode metal layer may be fabricated from a material selected from at least one of silver, gold, copper, nickel, palladium, platinum, and alloys thereof.

The method may further include attaching a temporary buffer tape to the first face of the wafer. The temporary buffer tape may be an ultraviolet tape. The temporary buffer tape may have at least one opening for a plating electrode. Forming the holes may include forming at least one hole for a plating electrode. Forming the electrode metal layers may include forming a metal layer in the hole for the plating electrode.

Forming the plated bumps may include providing the wafer in a plating solution such that the second face of the wafer touches the plating solution. Further, forming the plated bump may include providing an anode within the plating solution and coupling a cathode to the electrode metal layers. The plated bumps may be fabricated from a material selected from at least one of gold, nickel, copper, and solder.

The method may further involve removing the temporary buffer tape from the first face of the wafer.

According to another exemplary embodiment of the present invention, the method may involve providing a wafer including a first face, a second face, and a chip pad on the first face. A blind hole may be formed in the wafer that penetrates through the chip pad. A metal layer may be formed on the first face of the wafer and an inner surface of the blind hole. The blind hole may be filled with an electrode metal layer. A portion of the wafer may be ground so that the electrode metal layer is exposed through the second face of the wafer. A bump may be electroplated on the electrode metal layer exposed through the second face of the wafer.

According to another exemplary embodiment, the method may involve providing a wafer having a first face and a second face. Blind holes may be formed in the first face of the wafer. The blind holes may be filled with respective electrode metal layers. A portion of the wafer may be removed so that the electrode metal layers are exposed through the second face of the wafer. Bumps may be electroplated on the electrode metal layers exposed through the second face of the wafer.

BRIEF DESCRIPTION OF THE DRAWINGS

FIGS. 1 to 13 illustrate a method of fabricating a wafer level chip scale package in accordance with an exemplary, non-limiting embodiment of the present invention.

FIG. 1 is a schematic plan view of an example semiconductor wafer.

FIG. 2 is a partially enlarged plan view of an example integrated circuit chip.

FIG. 3 is a cross-sectional view taken along the line III-III of FIG. 2.

FIG. 4 is a cross-sectional view showing an example of forming a hole in a silicon substrate.

FIG. 5 is a cross-sectional view showing an example of forming an insulating layer on inner surfaces of the hole.

FIG. 6 is a cross-sectional view showing an example of forming a base metal layer over the wafer.

FIG. 8 is a cross-sectional view showing an example of grinding the wafer.

FIG. 9 is a cross-sectional view showing an example of attaching a temporary buffer tape to the wafer.

FIG. 10 is a cross-sectional view showing an example of forming a plated bump under the electrode metal layer.

FIG. 11 is a cross-sectional view showing an example of removing the temporary buffer tape from the wafer.

FIG. 12 is a cross-sectional view showing an example of isolating a connection electrode by selectively removing the base metal layer.

FIG. 13 is a cross-sectional view showing an example of separating individual packages from the wafer.

DETAILED DESCRIPTION OF EXEMPLARY EMBODIMENTS OF THE INVENTION

Figure 1:
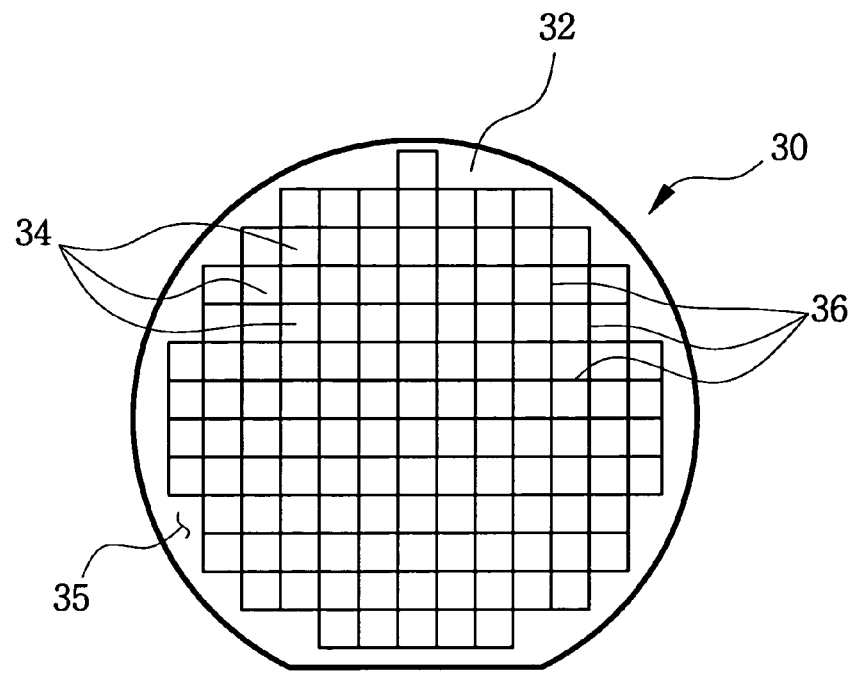

Exemplary, non-limiting embodiments of the present invention will now be described more fully with reference to the accompanying drawings. This invention may, however, be embodied in many different forms and should not be construed as limited to the exemplary embodiments. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In this disclosure, well-known structures and processes may not described or illustrated in detail to avoid obscuring the present invention. Furthermore, the figures are not drawn to scale. Rather, for simplicity and clarity of illustration, the dimensions of some of the elements may be exaggerated relative to other elements. A layer may be considered as being formed (or otherwise provided) "on" another layer or a substrate when formed either directly on the referenced layer or the substrate or formed (or otherwise provided) on other layers or patterns overlaying the referenced layer or the substrate. Like reference numerals are used for like and corresponding parts of the various drawings.

FIGS. 1 to 13 illustrate a method of fabricating a wafer level chip scale package (WLCSP), which may be suitable for a package stack, in accordance with an exemplary, non-limiting embodiment of the present invention.

As shown in FIG. 1, a semiconductor wafer 30 may include a plurality of integrated circuit (IC) chips 34 that may be fabricated in a substrate 32. In this example embodiment, the substrate 32 may be fabricated from a silicon material, but the invention is not limited in this regard since the substrate may be suitably fabricated from numerous, alternative materials. Wafer fabrication techniques are well known in the art, and therefore related descriptions are omitted. Scribe lanes 36 may extend between the IC chips 34.

Figure 2:
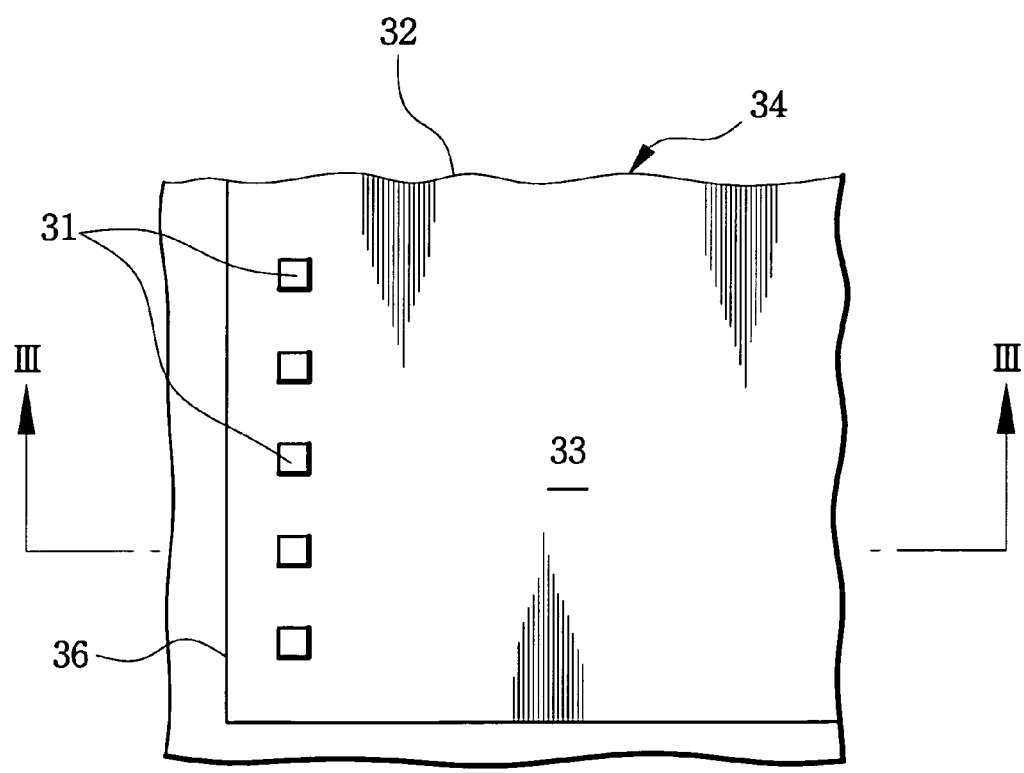
Figure 3:
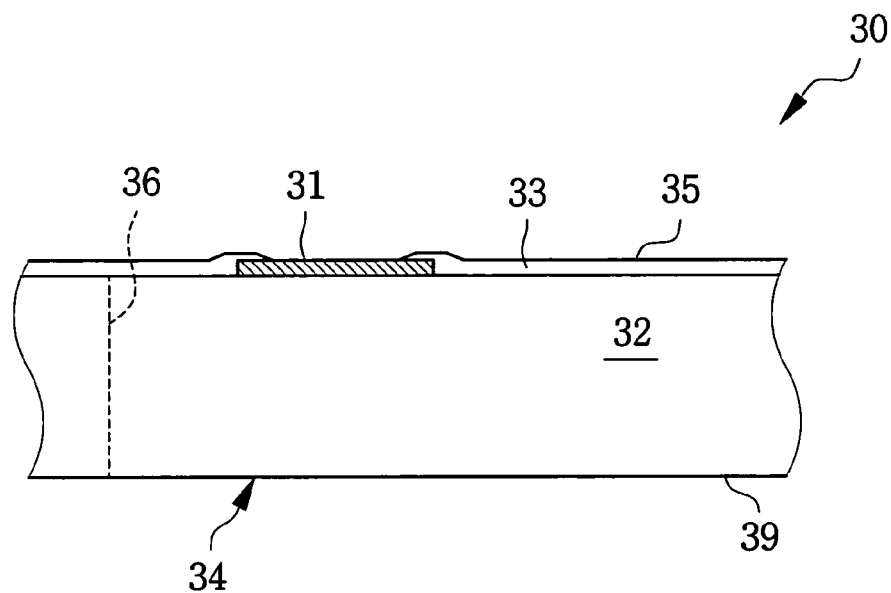

FIG. 2 partially shows, in an enlarged plan view, the IC chip 34. FIG. 3 is a cross-sectional view taken along the line III-III of FIG. 2. Referring to FIGS. 2 and 3, each IC chip 34 may have a number of chip pads 31 disposed on a face 35 of the wafer 30 that may be electrically coupled to integrated circuits (not shown) formed in the silicon substrate 32. The face 35 of the wafer 30 may be covered with a passivation layer 33. The chip pads 31 may be exposed through the passivation layer 33. The chip pads 31 may be fabricated from aluminum or copper. However, the invention is not limited in this regard since the chip pads 31 may be fabricated from numerous, alternative materials. The passivation layer 33 may be fabricated from silicon oxide, silicon nitride, silicon oxynitride or combinations thereof. However, the invention is not limited in this regard since the passivation layer 33 may be fabricated from numerous, alternative materials. The chip pads 31 may be arranged in at least one row along edges of the IC chip 34, but the invention is not limited in this regard since the chip pads 31 may be arranged in numerous and varied patterns. Further, the invention is not limited to any particular number of chip pads 31 being provided on the IC chips 34.

Figure 4:
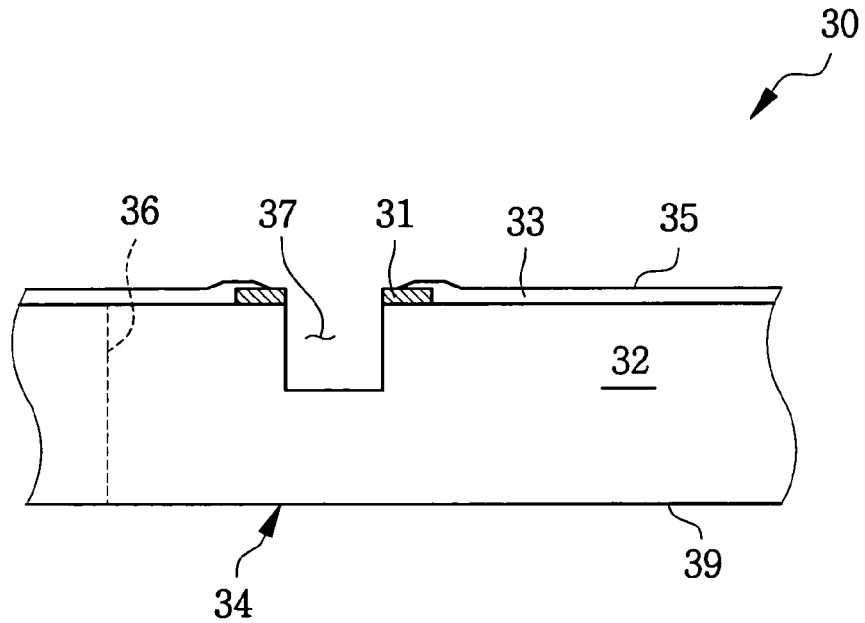

FIG. 4 shows, in a cross-sectional view, an example of forming a hole 37. As shown in FIG. 4, the hole 37 may be formed to completely penetrate the chip pad 31 and partially penetrate the silicon substrate 32. As will be discussed below, the hole 37 may accommodate an electrical connection electrode of the IC chip 34. The hole 37 may be formed using laser drilling, wet etching, dry etching, or any other conventional hole forming technique. The hole 37 may have a uniform width and vertical sidewalls, as shown in FIG. 4. However, the invention is not limited in this regard. For example, the hole may have a non-uniform width, and may include sidewalls that are flat, curved, tapered, inclined (relative to the face 35), etc. Further, the hole may extend laterally beyond the lateral extremities of the chip pad 31.

Figure 5:
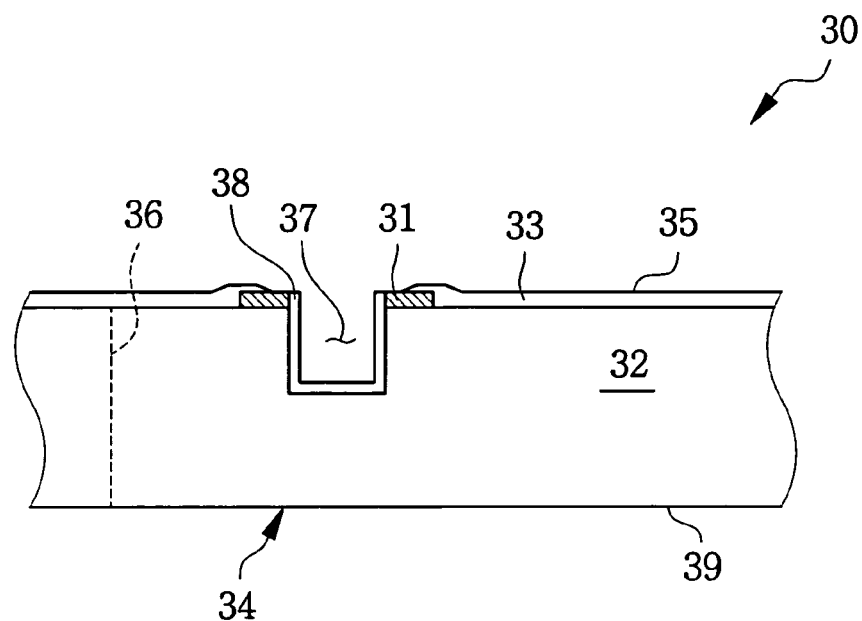

FIG. 5 shows, in a cross-sectional view, an example of forming an insulating layer 38. As shown in FIG. 5, the insulating layer 38 may be formed on inner surfaces of the hole 37. The insulating layer 38 may electrically isolate the electrical connection electrode, which will be formed in the hole 37, from the silicon substrate 32. In FIG. 5, the insulating layer 38 may be formed on all surfaces of the hole 37. However, the invention is not limited in this regard as the insulating layer 38 may be formed only on sidewalls of the hole 37, but not on the bottom wall of the hole 37. A surface of the chip pad 31 may not be covered with the insulating layer 38.

The insulating layer 38 may be fabricated from an oxide, a nitride or combinations thereof. However, the invention is not limited in this regard as the insulating layer 38 may be fabricated from numerous, alternative materials. To form the insulating layer 38, a mask (not shown) may be temporarily coated on the wafer 30. The mask may have an aperture corresponding to the hole 37. Then the insulating layer 38 may be selectively formed on the surfaces of the hole 37 through the aperture by using a chemical vapor deposition (CVD) technique, for example. However, the invention is not limited in this regard as other, alternative forming techniques may be suitably implemented.

Figure 6:
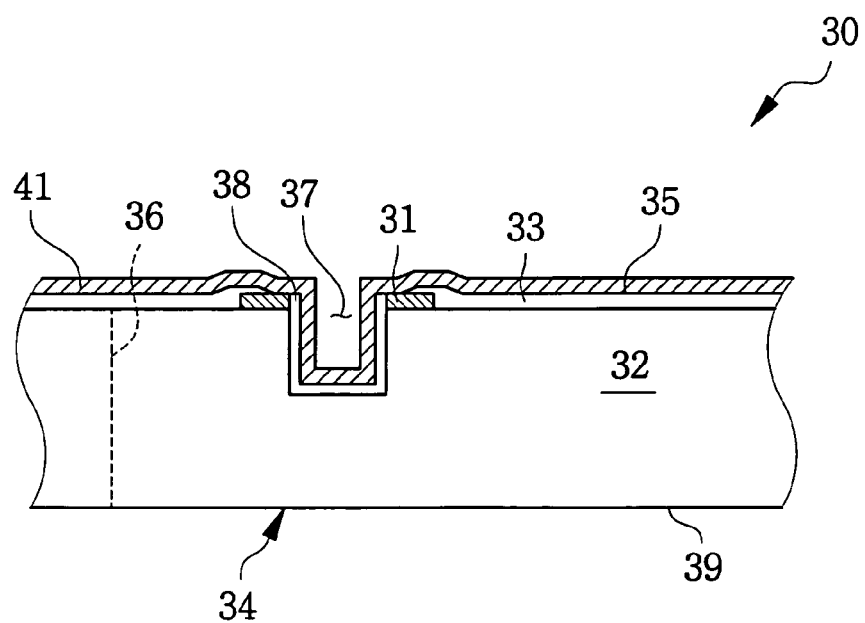

FIG. 6 shows, in a cross-sectional view, an example of forming a base metal layer 41 over the face 35 of the wafer 30. As shown in FIG. 6, the base metal layer 41 may cover the insulating layer 38 in the hole 37, the chip pad 31, and the passivation layer 33. The base metal layer 41 may be composed of two or more metals. By way of example only, and not as a limitation of the invention, the base metal layer may include an inside metal and an outside metal. The inside metal may be fabricated from chromium, titanium, or some other metal that may have a good adhesive property with the insulating layer 38. The outside metal may be fabricated from silver, gold, copper, nickel, palladium, platinum, or some other metal that may have good adhesive property with an electrode metal layer that may be formed in the hole 37. The base metal layer 41 may be formed by a sputtering technique, for example, and may have a thickness of about 5 to 10 microns. However, the invention is not limited in this regard as numerous, alternative forming techniques may be suitably implemented. Further, the base metal layer 41 may be of an alternative thickness.

Figure 7A:
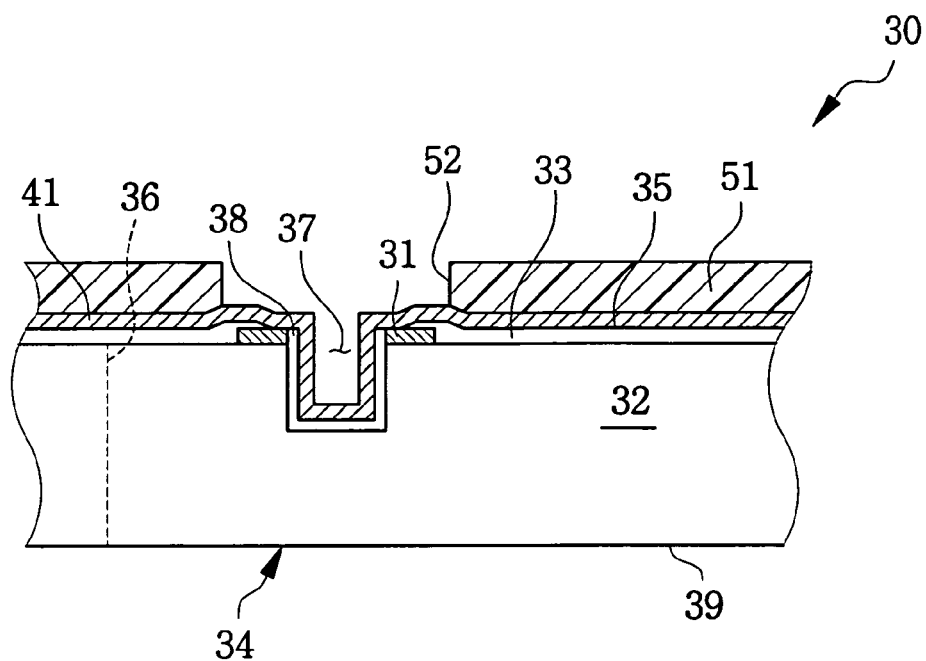
FIGS. 7A to 7C are cross-sectional views showing an example of forming an electrode metal layer in and over the hole.
Figure 7B:
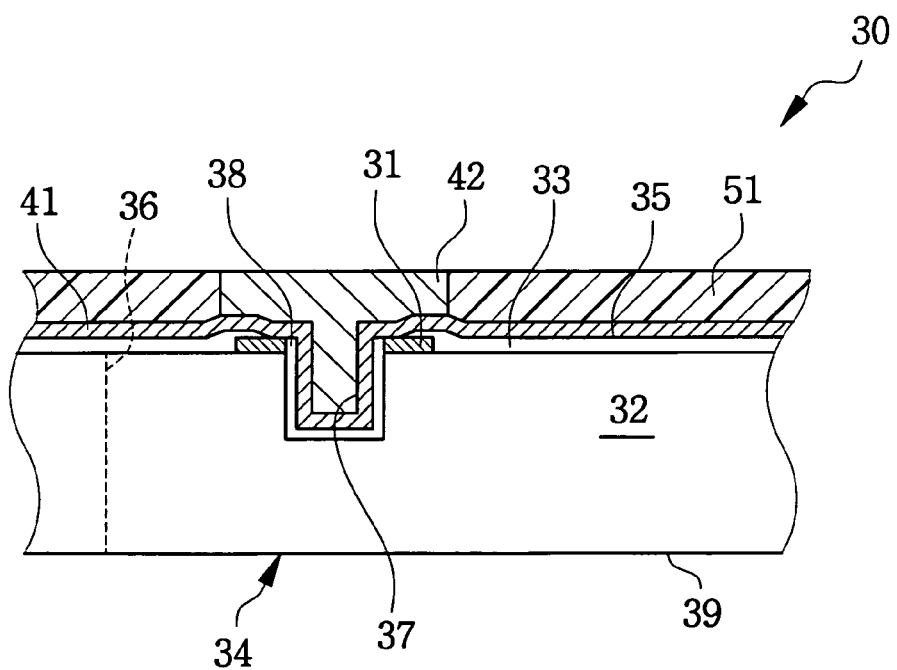
Figure 7C:
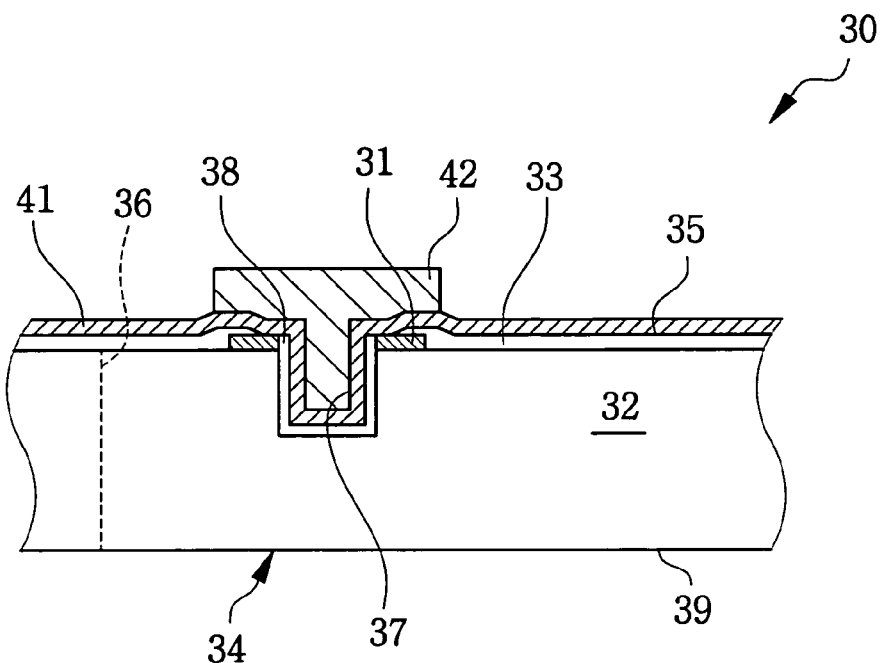

FIGS. 7A to 7C show, in respective cross-sectional views, an example of forming the electrode metal layer 42. In this example embodiment, the electrode metal layer 42 may be formed in and over the hole 37. A photoresist layer may be coated on the wafer 30 and then patterned to a photoresist mask 51 as shown in FIG. 7A. The photoresist mask 51 may have a window 52 selectively exposing the base metal layer 41. The exposed portion of the base metal layer 41 may be superposed over the chip pad 31 and provided in the hole 37.

As shown in FIG. 7B, the electrode metal layer 42 may be formed on the base metal layer 41 exposed through the window 52 of the photoresist mask 51. By way of example only, and not as a limitation of the invention, an electroplating technique may be used for forming the electrode metal layer 42. Here, the base metal layer 41 may be used as a plating electrode. The electrode metal layer 42 may fill the hole 37 and extend out of the hole 37. As shown in FIG. 7B, the electrode metal layer 41 may be superposed over the chip pad 31, but the invention is not limited in this regard. The electrode metal layer 42 may be fabricated from silver, gold, copper, nickel, palladium, platinum, an alloy thereof, or some other suitable metal.

The photoresist mask 51 may be removed as shown in FIG. 7C. As a result, the electrode metal layer 42 may remain raised on the chip pad 31 and the hole 37. In this example embodiment, the base metal layer 41 may be used as a plating electrode during a subsequent electroplating process as will be discussed below.

Figure 8:
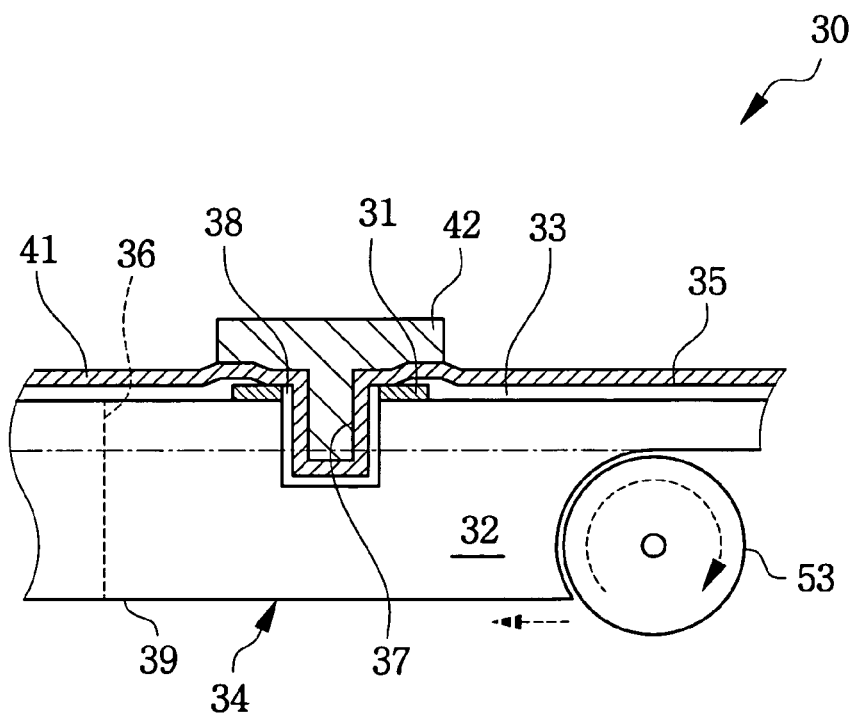

FIG. 8 shows, in a cross-sectional view, an example of grinding the wafer 30. As shown in FIG. 8, a grinder 53 may grind a face 39 of the wafer 30. As a result of grinding, parts of the silicon substrate 32 may be removed, and further, the electrode metal layer 42 in the hole 37 may be exposed through the face 39 of the wafer 30. By way of example only, and not as a limitation of the invention, the wafer 30 may have a thickness of about 700 microns before grinding, and may be thinned to a thickness of about 100 microns or below after grinding.

According to this example embodiment of the present invention, the grinding technique alone may be implemented to expose the electrode metal layer 42 through the face 39. This may be contrary to the conventional wisdom that may teach implementation of both grinding and etching techniques. In this regard, example embodiments of the present invention may provide a process that may be simplified and shortened as compared to conventional approaches.

As shown in FIG. 7B, the electrode metal layer 42 may be formed on the base metal layer 41 exposed through the window 52 of the photoresist mask 51. By way of example only, and not as a limitation of the invention, an electroplating technique may be used for forming the electrode metal layer 42. Here, the base metal layer 41 may be used as a plating electrode. The electrode metal layer 42 may fill the hole 37 and extend out of the hole 37. As shown in FIG. 7B, the electrode metal layer 42 may be superposed over the chip pad 31, but the invention is not limited in this regard. The electrode metal layer 42 may be fabricated from silver, gold, copper, nickel, palladium, platinum, an alloy thereof, or some other suitable metal.

Figure 9:
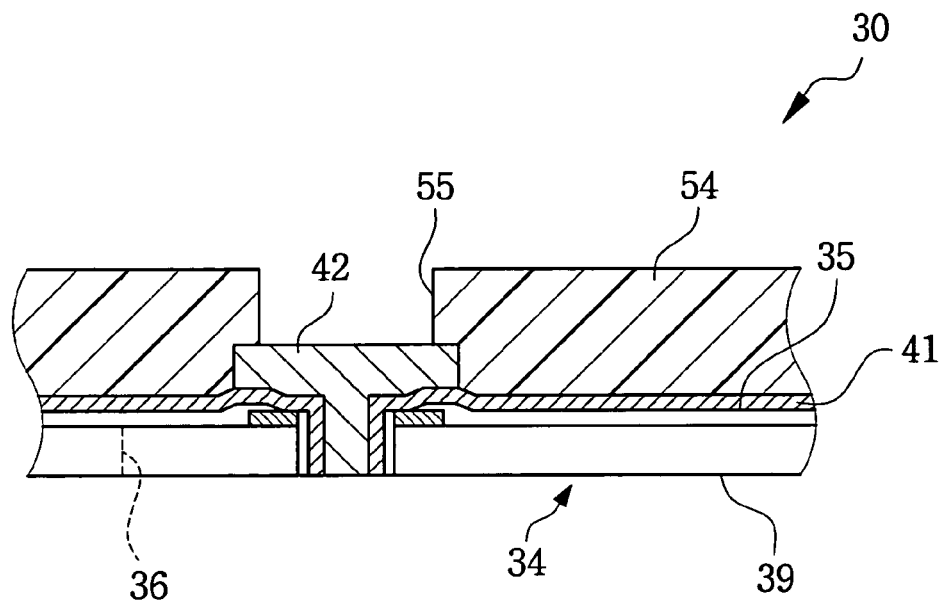

FIG. 9 shows, in a cross-sectional view, an example of attaching a temporary buffer tape 54 to the face 35 of the wafer 30. As shown in FIG. 9, the temporary buffer tape 54 may be attached to the wafer 30, exposing the electrode metal layer 42. The temporary buffer tape 54 may have at least one opening 55 for exposing a portion of the electrode metal layer 42 and/or the base metal layer 41. The exposed portion of the electrode metal layer 42 and/or the base metal layer 41 may be provided at a location at which a plating electrode may be coupled in an electroplating process.

Figure 10:
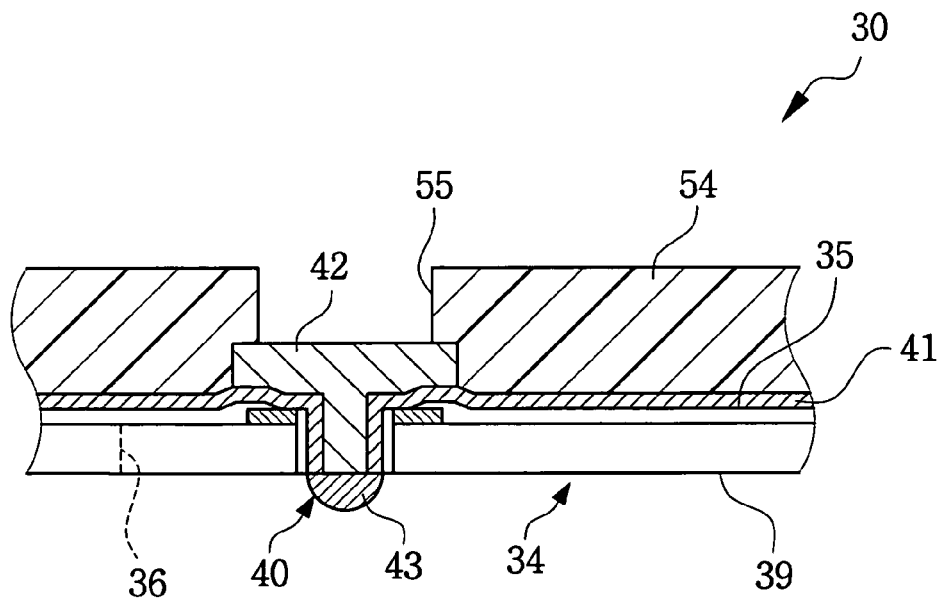

FIG. 10 shows, in a cross-sectional view, an example of forming a plated bump 43 on the electrode metal layer 42. As shown in FIG. 10, the plated bump 43 may be formed on the electrode metal layer 42 exposed through the face 39 of the wafer 30. The plated bump 43 and the electrode metal layer 42 may together form the electrical connection electrode 40. An electroplating technique may be used for forming the plated bump 43. One example of an electroplating process is shown in FIG. 14.

Figure 14:
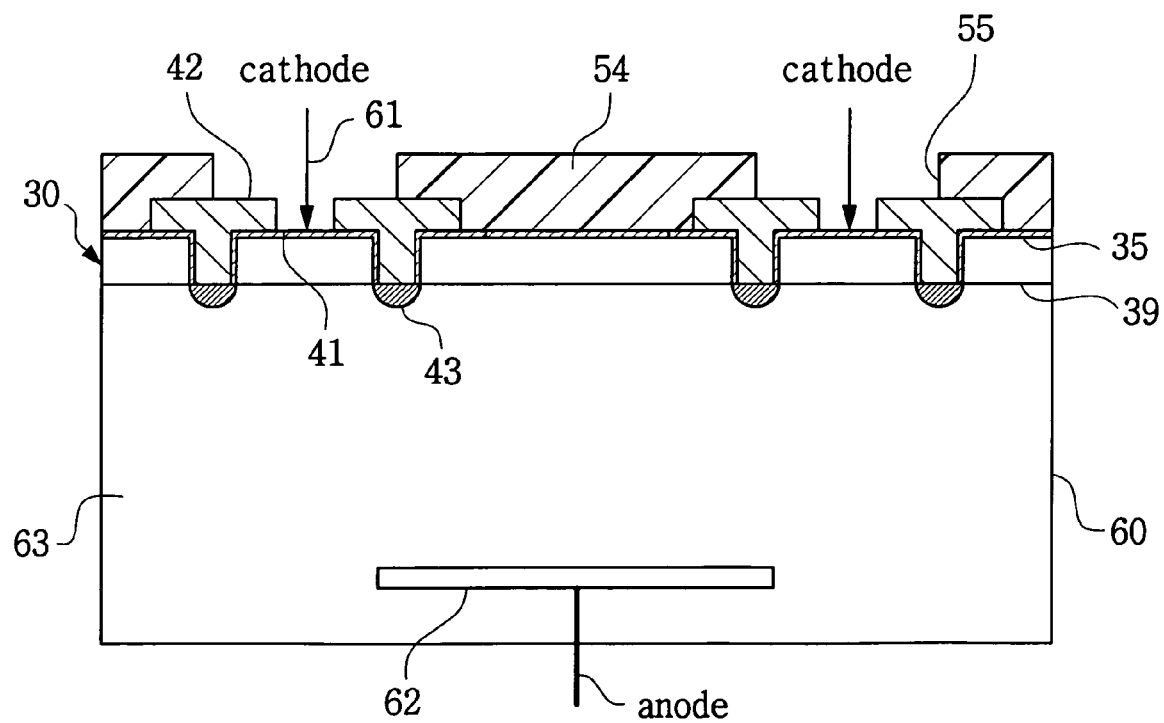
FIG. 14 is a schematic view showing an example of forming a plated bump by electroplating.

Referring to FIG. 14, a plating bath 60 may be filled with a plating solution 63, and an anode 62 may be provided within the plating bath 60. The wafer 30 may be immersed in the plating solution 63 so that the face 39 of the wafer 30 may touch the plating solution 63. A cathode 61 may be coupled to the electrode metal layer 42 and/or the base metal layer 41 exposed through the opening 55 of the temporary buffer tape 54. A one-point connection with the cathode 61 may be sufficient for forming a plated bump 43 on a plurality of electrode metal layers 42 since the base metal layer 41 may electrically connect together every electrode metal layer 42. However, the invention is not limited to a one-point connection between the cathode and the electrode metal layer 42 and/or the base metal layer 41 since multiple-point connections may be suitably implemented as shown in FIG. 14.

In the above-discussed electroplating process, the plated bump 43 may be formed to a suitable height. Such electroplating process may avoid the need to use the photolithography technique used in the conventional plating process discussed above as background. The material of the plated bump 43 may depend on the material of the plating solution 63 and the material of the anode 62. The anode 62 may fabricated from gold, nickel, copper, solder, or some other suitable metal.

Figure 11:
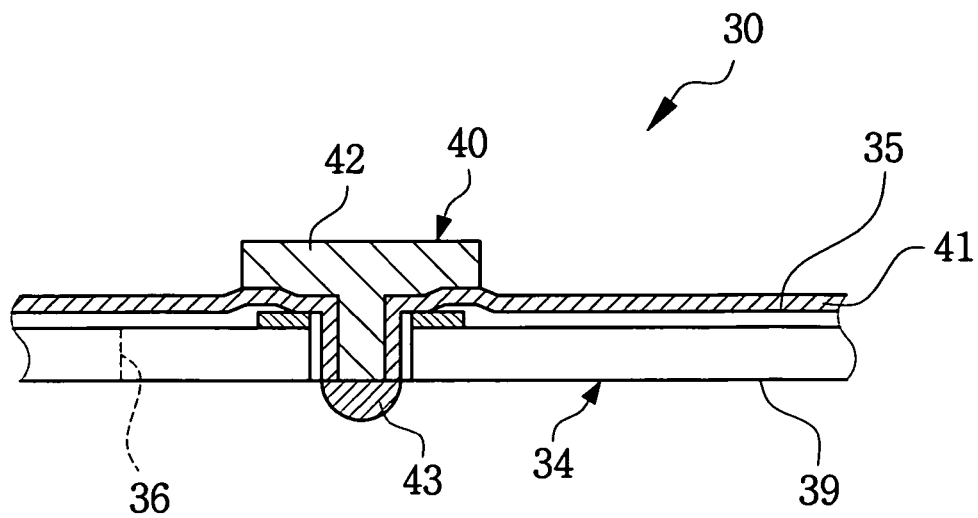

After the plated bump 43 is formed, the temporary buffer tape 54 may be removed. FIG. 11 shows, in a cross-sectional view, an example of removing the temporary buffer tape from the wafer 30. If the above-mentioned ultraviolet tape is used as the temporary buffer tape, the ultraviolet tape may be detached from the wafer 30 by applying ultraviolet rays.

Figure 12:
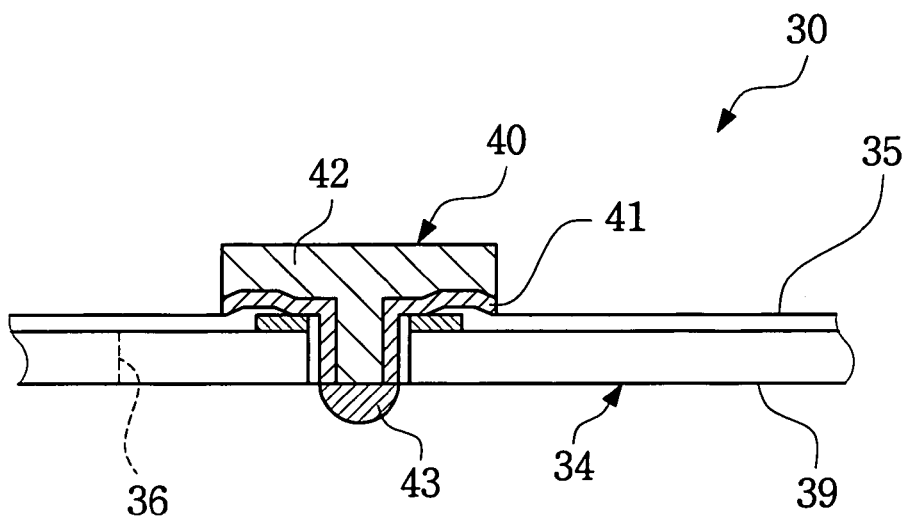

FIG. 12 shows, in a cross-sectional view, an example of isolating the connection electrode 40 by selectively removing the base metal layer 41. Referring to FIG. 12, the base metal layer 41, existing between the adjacent electrode metal layers 42, may be removed by an etching technique. Here, the electrode metal layer 42 may be used as an etching mask. In this way, adjacent connection electrodes 40 may be electrically isolated from each other. The invention is not limited to the etching technique described above. For example, numerous and alternative material removal techniques may be suitably implemented.

Figure 13:
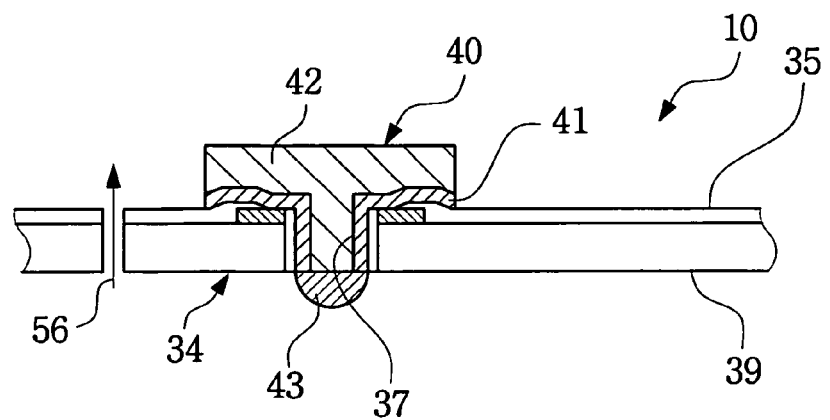

FIG. 13 shows, in a cross-sectional view, an example of separating individual packages 10. As shown in FIG. 13, a cutting tool 56, such as a diamond wheel or a laser (for example), may saw the wafer 30 along the scribe lane to separate individual packages 10 from the wafer 30. The invention is not limited to the cutting technique described above since numerous and alternative singulation techniques may be suitably implemented. For example, a die may be used to dice the wafer 30 along the scribe lanes into individual packages 10.

Figure 15:
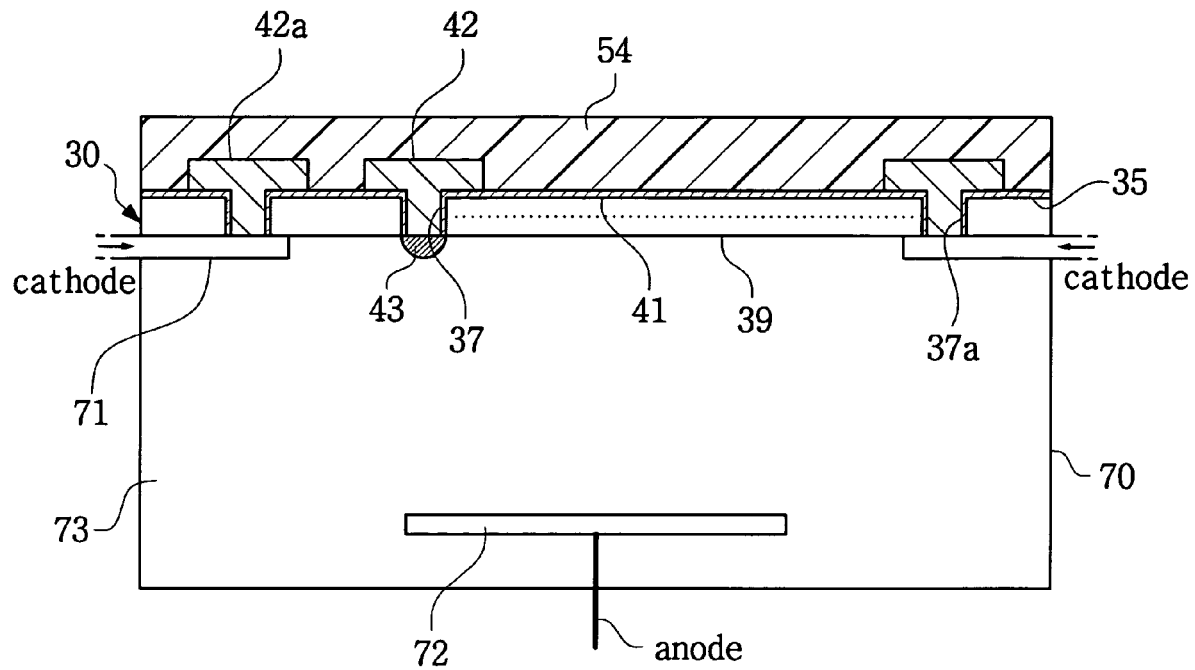
FIG. 15 is a schematic view showing another example of forming a plated bump by electroplating.
Figure 16:
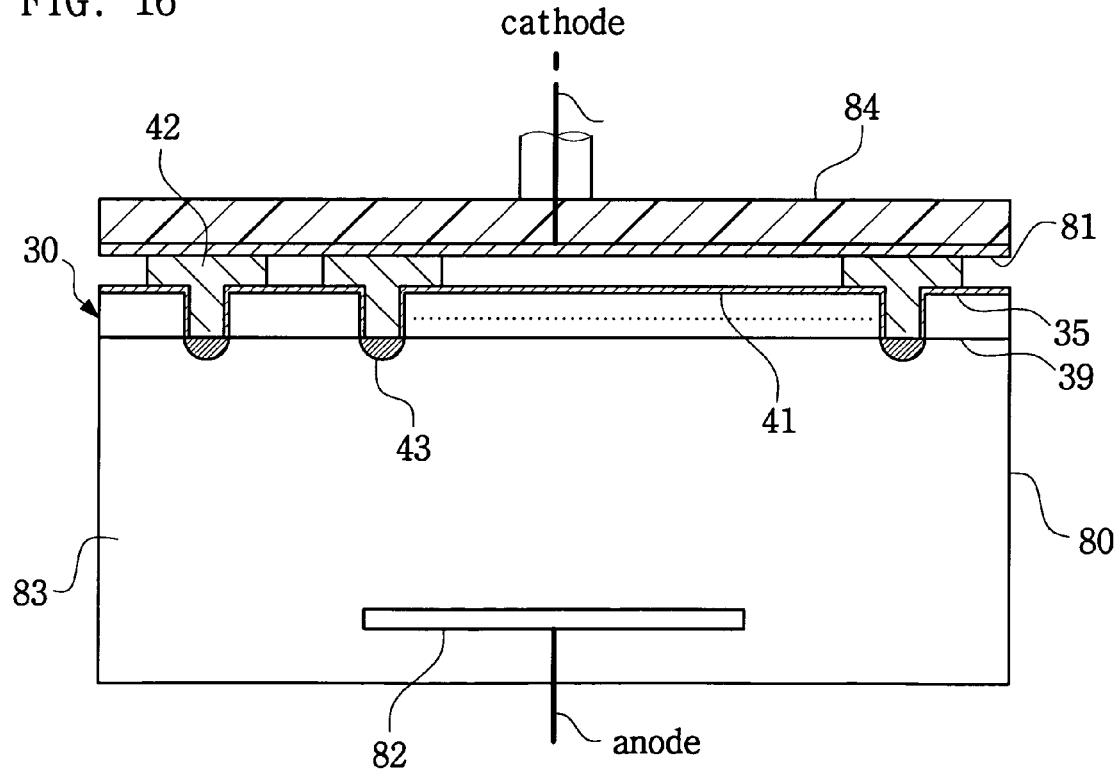
FIG. 16 is a schematic view showing another example of forming a plated bump by electroplating.

One example of an electroplating process for forming the plated bump 43 has been described above with reference to FIG. 14. FIGS. 15 and 16 respectively illustrate alternative examples of the electroplating process.

Referring to FIG. 15, a plating bath 70 may be filled with a plating solution 73, and an anode 72 may be provided within the plating bath 70. The wafer 30 may be immersed in the plating solution 73 so that the face 39 of the wafer 30 may touch the plating solution 73. A cathode 71 may be coupled to a metal layer 42a exposed through the face 39 of the wafer 30 via a hole 37a. Therefore, in this example embodiment, the opening in the temporary buffer tape 54 may not be provided. The hole 37a may be formed in a similar fashion and at the same manufacture stage as the hole 37. The metal layer 42a may be formed in a similar fashion and at the same manufacture stage as the electrode metal layer 42. Each electrode metal layer 42 may be electrically connected to the metal layer 42a through the base metal layer 41. The cathode 71 may be electrically isolated from the plating solution 73.

The alternative example shown in FIG. 16 may be implemented, for example, when the wafer 30 is relatively thick and therefore the temporary buffer tape may not be used. A plating bath 80 may be filled with a plating solution 83, and an anode 82 may be provided within the plating bath 80. The wafer 30 may be immersed in the plating solution 83 so that the face 39 of the wafer 30 may touch the plating solution 83. A cathode 81 may be disposed on a pressing tool 84 and pressed onto the wafer 30. In this way, the cathode 81 may be electrically coupled to the electrode metal layer 42. The pressing tool 84 may be fabricated from an insulating material.

In the above-discussed three examples of the electroplating process, the wafer 30 may not be completely immersed in the plating solution. Instead, the face 39 of the wafer 30 may only touch the plating solution. However, the entire wafer may be dipped in the plating solution. In this case, the face 35 of the wafer 30 may be protected from the plating solution.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method for fabricating a wafer level chip scale package, the method comprising:
   providing a wafer including a first face, a second face, a plurality of integrated circuit (IC) chips having chip pads on the first face, and scribe lanes running between the IC chips;
   forming holes in the first face of the wafer such that the holes respectively penetrate through the chip pads;
   forming a base metal layer on the first face of the wafer such that the base metal layer covers inner surfaces of the holes;
   forming electrode metal layers respectively on the chip pads such that the electrode metal layers respectively fill the holes;
   grinding the second face of the wafer such that the electrode metal layers are exposed through the second face of the wafer;
   after grinding the second face of the wafer, attaching a temporary buffer tape to the base metal layer on the first face of the wafer;
   forming plated bumps respectively on the electrode metal layers exposed through the second face of the wafer;
   removing the temporary buffer tape from the first face of the wafer;
   selectively removing the base metal layer located between the electrode metal layers after removing the temporary buffer tape; and
   separating the wafer along the scribe lanes.

2. The method of claim 1, further comprising:
   forming an insulating layer on inner surfaces of the holes.

3. The method of claim 1, wherein the holes are formed by at least one of laser drilling, wet etching, and dry etching.

4. The method of claim 1, wherein the base metal layer is fabricated from a material selected from at least one of chromium, titanium, silver, gold, copper, nickel, palladium, platinum, and alloys thereof.

5. The method of claim 1, wherein the electrode metal layer is fabricated from a material selected from at least one of silver, gold, copper, nickel, palladium, platinum, and alloys thereof.

6. The method of claim 1, wherein the temporary buffer tape is an ultraviolet tape.

7. The method of claim 1, wherein the temporary buffer tape has at least one opening for a plating electrode.

8. The method of claim 1, wherein forming the holes includes forming at least one hole for a plating electrode.

9. The method of claim 8, wherein forming the electrode metal layers includes forming a metal layer in the hole for the plating electrode.

10. The method of claim 1, wherein forming the plated bumps includes providing the wafer in a plating solution such that the second face of the wafer touches the plating solution.

11. The method of claim 10, wherein forming the plated bumps further includes providing an anode within the plating solution and coupling a cathode to the electrode metal layers.

12. The method of claim 1, wherein the plated bumps are fabricated from a material selected from at least one of gold, nickel, copper, and solder.

* * * * *